(12) United States Patent
Ankoudinov et al.

(10) Patent No.: US 9,012,954 B2
(45) Date of Patent: Apr. 21, 2015

(54) ADJUSTABLE FIELD EFFECT RECTIFIER

(75) Inventors: Alexei Ankoudinov, Redmond, WA (US); Vladimir Rodov, Seattle, WA (US)

(73) Assignee: STMicroelectronics International B.V., Amsterdam (NL)

( * ) Notice: Subject to any disclaimer, the term of this patent is extended or adjusted under 35 U.S.C. 154(b) by 0 days.

(21) Appl. No.: 13/398,591

(22) Filed: Feb. 16, 2012

(65) Prior Publication Data

US 2012/0211798 A1 Aug. 23, 2012

Related U.S. Application Data

(63) Continuation of application No. 12/238,308, filed on Sep. 25, 2008, now Pat. No. 8,148,748.

(60) Provisional application No. 60/975,467, filed on Sep. 26, 2007, provisional application No. 61/022,968, filed on Jan. 23, 2008, provisional application No. 61/048,336, filed on Apr. 28, 2008.

(51) Int. Cl.
*H01L 29/68* (2006.01)
*H01L 29/78* (2006.01)
*H01L 29/861* (2006.01)
*H01L 29/417* (2006.01)
*H01L 29/08* (2006.01)

(52) U.S. Cl.
CPC ......... *H01L 29/861* (2013.01); *H01L 29/41766* (2013.01); *H01L 29/7802* (2013.01); *H01L 29/0878* (2013.01)

(58) Field of Classification Search
CPC ............ H01L 29/0619; H01L 29/7802; H01L 29/7396; H01L 29/7455; H01L 29/7803; H01L 29/7804; H01L 29/7806; H01L 29/7808; H01L 29/7813; H01L 27/0705; H01L 27/0727
USPC .................. 257/124, 133, 135, 328, E29.066, 257/E29.257; 438/135, 138
See application file for complete search history.

(56) References Cited

U.S. PATENT DOCUMENTS 3,602,777 A 8/1971 Berman
3,603,811 A 9/1971 Day et al.
4,281,448 A 8/1981 Barry et al.

(Continued)

FOREIGN PATENT DOCUMENTS

EP 0322400 A2 6/1989
EP 0 807 979 A2 11/1997

(Continued)

OTHER PUBLICATIONS

Office Action from U.S. Appl. No. 12/683,425, dated Jun. 20, 2012.

(Continued)

*Primary Examiner* — Marvin Payen
*Assistant Examiner* — Jeremy Joy
(74) *Attorney, Agent, or Firm* — Allen, Dyer, Doppelt, Milbrath & Gilchrist, P.A.

(57) ABSTRACT

An Adjustable Field Effect Rectifier uses aspects of MOSFET structure together with an adjustment pocket or region to result in a device that functions reliably and efficiently at high voltages without significant negative resistance, while also permitting fast recovery and operation at high frequency without large electromagnetic interference.

9 Claims, 11 Drawing Sheets

(56) References Cited

U.S. PATENT DOCUMENTS

| | | |
|---|---|---|
| 4,373,252 A | 2/1983 | Caldwell |
| 4,533,970 A | 8/1985 | Brown |
| 4,599,576 A | 7/1986 | Yoshida et al. |
| 4,610,730 A | 9/1986 | Harrington et al. |
| 4,630,084 A * | 12/1986 | Tihanyi ............... 257/342 |
| 4,722,856 A | 2/1988 | Albrecht et al. |
| 4,760,431 A * | 7/1988 | Nakagawa et al. ........ 257/138 |
| 4,783,348 A | 11/1988 | Albrecht et al. |
| 4,843,441 A | 6/1989 | Willard |
| 4,903,189 A | 2/1990 | Ngo et al. |
| 4,955,069 A | 9/1990 | Ionescu |
| 4,962,411 A | 10/1990 | Tokura et al. |
| 4,967,243 A | 10/1990 | Baliga et al. |
| 4,969,028 A * | 11/1990 | Baliga ............... 257/124 |
| 4,980,741 A * | 12/1990 | Temple ............... 257/154 |
| 4,982,260 A | 1/1991 | Chang et al. |
| 4,996,581 A | 2/1991 | Hamasaki |
| 5,019,530 A | 5/1991 | Kleinsasser et al. |
| 5,021,861 A | 6/1991 | Baliga |
| 5,070,377 A * | 12/1991 | Harada ............... 257/336 |
| 5,111,253 A | 5/1992 | Korman et al. |
| 5,144,400 A * | 9/1992 | Bauer ............... 257/138 |
| 5,291,040 A | 3/1994 | Oppermann et al. |
| 5,304,831 A * | 4/1994 | Yilmaz et al. ........ 257/341 |
| 5,381,025 A * | 1/1995 | Zommer ............... 257/138 |
| 5,387,805 A | 2/1995 | Metzler et al. |
| 5,396,085 A | 3/1995 | Baliga |
| 5,410,171 A | 4/1995 | Tsuzuki et al. |
| 5,416,354 A | 5/1995 | Blackstone |
| 5,430,315 A | 7/1995 | Rumennik |
| 5,446,295 A | 8/1995 | Whitney |
| 5,532,502 A | 7/1996 | Seki |
| 5,545,573 A | 8/1996 | Narazaki et al. |
| 5,554,880 A | 9/1996 | Metzler et al. |
| 5,559,355 A * | 9/1996 | Yamazaki et al. ........ 257/341 |
| 5,621,234 A * | 4/1997 | Kato ............... 257/339 |
| 5,629,536 A | 5/1997 | Heminger et al. |
| 5,637,888 A * | 6/1997 | Iwamuro ............... 257/139 |
| 5,643,809 A | 7/1997 | Lien |
| 5,719,411 A | 2/1998 | Ajit |
| 5,742,463 A | 4/1998 | Harris |
| 5,744,994 A * | 4/1998 | Williams ............... 327/374 |
| 5,747,841 A | 5/1998 | Ludikhuize |
| 5,751,025 A | 5/1998 | Heminger et al. |
| 5,818,084 A * | 10/1998 | Williams et al. ........ 257/329 |
| 5,825,079 A | 10/1998 | Metzler et al. |
| 5,869,380 A | 2/1999 | Chang |
| 5,877,515 A | 3/1999 | Ajit |
| 5,886,383 A | 3/1999 | Kinzer |
| 5,898,982 A | 5/1999 | Metzler et al. |
| 5,929,690 A | 7/1999 | Williams |
| 5,932,922 A | 8/1999 | Metzler et al. |
| 5,956,582 A | 9/1999 | Ayela et al. |
| 6,034,385 A | 3/2000 | Stephani et al. |
| 6,048,788 A | 4/2000 | Huang et al. |
| 6,051,850 A * | 4/2000 | Park ............... 257/133 |
| 6,078,074 A | 6/2000 | Takebuchi et al. |
| 6,097,046 A | 8/2000 | Plumton |
| 6,100,145 A | 8/2000 | Kepler et al. |
| 6,169,300 B1 * | 1/2001 | Fragapane ............ 257/146 |
| 6,172,398 B1 | 1/2001 | Hshieh |
| 6,186,408 B1 | 2/2001 | Rodov et al. |
| 6,225,280 B1 | 5/2001 | Dokter et al. |
| 6,235,601 B1 | 5/2001 | Kim |
| 6,242,324 B1 | 6/2001 | Kub et al. |
| 6,258,634 B1 | 7/2001 | Wang et al. |
| 6,268,758 B1 | 7/2001 | Limmer et al. |
| 6,281,547 B1 | 8/2001 | So et al. |
| 6,313,001 B1 | 11/2001 | Johansson et al. |
| 6,323,091 B1 | 11/2001 | Lee et al. |
| 6,331,455 B1 | 12/2001 | Rodov et al. |
| 6,362,036 B1 | 3/2002 | Chiozzi et al. |
| 6,373,097 B1 | 4/2002 | Werner |
| 6,384,456 B1 | 5/2002 | Tihanyi |
| 6,399,996 B1 | 6/2002 | Chang et al. |
| 6,404,033 B1 | 6/2002 | Chang et al. |
| 6,420,225 B1 | 7/2002 | Chang et al. |
| 6,426,541 B2 | 7/2002 | Chang et al. |
| 6,448,160 B1 | 9/2002 | Chang et al. |
| 6,459,108 B1 | 10/2002 | Bartsch et al. |
| 6,476,442 B1 | 11/2002 | Williams et al. |
| 6,498,367 B1 * | 12/2002 | Chang et al. ............ 257/341 |
| 6,515,330 B1 | 2/2003 | Hurtz et al. |
| 6,537,860 B2 | 3/2003 | Akiyama et al. |
| 6,593,620 B1 | 7/2003 | Hshieh et al. |
| 6,624,030 B2 | 9/2003 | Chang et al. |
| 6,630,698 B1 | 10/2003 | Deboy et al. |
| 6,653,740 B2 | 11/2003 | Kinzer et al. |
| 6,724,039 B1 | 4/2004 | Blanchard |
| 6,743,703 B2 | 6/2004 | Rodov et al. |
| 6,765,264 B1 * | 7/2004 | Chang et al. ............ 257/336 |
| 6,784,489 B1 * | 8/2004 | Menegoli ............... 257/343 |
| 6,828,605 B2 | 12/2004 | Eisele et al. |
| 6,853,036 B1 | 2/2005 | Rodov et al. |
| 6,897,682 B2 | 5/2005 | Nadd |
| 6,956,266 B1 | 10/2005 | Voldman et al. |
| 6,967,374 B1 | 11/2005 | Saito et al. |
| 6,979,861 B2 | 12/2005 | Rodov et al. |
| 6,992,353 B1 * | 1/2006 | Wu ............... 257/335 |
| 7,009,253 B2 | 3/2006 | Rodov et al. |
| 7,087,981 B2 | 8/2006 | Kapels et al. |
| 7,095,113 B2 | 8/2006 | Xiaochun et al. |
| 7,220,319 B2 | 5/2007 | Sago et al. |
| 7,250,668 B2 | 7/2007 | Chang et al. |
| 7,264,999 B2 | 9/2007 | Xiaochun et al. |
| 7,342,389 B1 | 3/2008 | Wu et al. |
| RE40,222 E | 4/2008 | Fragapane |
| 7,560,782 B2 | 7/2009 | Pellizzer et al. |
| 7,781,826 B2 | 8/2010 | Mallikararjunaswamy et al. |
| 7,893,489 B2 | 2/2011 | Kobayashi |
| 8,148,748 B2 | 4/2012 | Ankoudinov et al. |
| 8,421,118 B2 | 4/2013 | Ankoudinov et al. |
| 2001/0045635 A1 | 11/2001 | Kinzer et al. |
| 2002/0019115 A1 | 2/2002 | Rodov et al. |
| 2002/0024375 A1 | 2/2002 | Asano et al. |
| 2002/0177324 A1 | 11/2002 | Metzler |
| 2003/0025152 A1 | 2/2003 | Werner et al. |
| 2003/0146474 A1 | 8/2003 | Ker et al. |
| 2003/0207538 A1 | 11/2003 | Hshieh et al. |
| 2003/0222290 A1 | 12/2003 | Rodov et al. |
| 2004/0041619 A1 | 3/2004 | Nadd |
| 2005/0029585 A1 | 2/2005 | He et al. |
| 2005/0116313 A1 | 6/2005 | Lee et al. |
| 2005/0152080 A1 | 7/2005 | Harris et al. |
| 2005/0189626 A1 | 9/2005 | Xiaochun et al. |
| 2005/0189658 A1 | 9/2005 | Xiaochun et al. |
| 2005/0200384 A1 | 9/2005 | Nadd |
| 2005/0200394 A1 | 9/2005 | Underwood et al. |
| 2005/0231355 A1 | 10/2005 | Hair, III et al. |
| 2005/0243496 A1 | 11/2005 | Harris |
| 2006/0097323 A1 | 5/2006 | Rodov et al. |
| 2006/0098363 A1 | 5/2006 | Hebert et al. |
| 2006/0098364 A1 | 5/2006 | Harris et al. |
| 2006/0098373 A1 | 5/2006 | Hebert et al. |
| 2006/0145260 A1 | 7/2006 | Kim |
| 2006/0158812 A1 | 7/2006 | Harris |
| 2006/0158816 A1 | 7/2006 | Harris et al. |
| 2006/0176638 A1 | 8/2006 | Coates |
| 2006/0244060 A1 | 11/2006 | Kapels et al. |
| 2006/0250736 A1 | 11/2006 | Harris |
| 2006/0285264 A1 | 12/2006 | Harris |
| 2007/0235752 A1 | 10/2007 | Rodov et al. |
| 2007/0246794 A1 | 10/2007 | Chang et al. |
| 2008/0017930 A1 | 1/2008 | Kim et al. |
| 2008/0079035 A1 | 4/2008 | Bobde |
| 2008/0137249 A1 | 6/2008 | Harris |
| 2008/0192394 A1 | 8/2008 | Harris |
| 2008/0265975 A1 | 10/2008 | Takasu et al. |
| 2008/0284383 A1 | 11/2008 | Aas et al. |
| 2009/0026492 A1 | 1/2009 | Chatty et al. |
| 2009/0078962 A1 | 3/2009 | Ankoudinov et al. |
| 2009/0267111 A1 | 10/2009 | Ankoudinov et al. |
| 2010/0163950 A1 | 7/2010 | Gladish et al. |

(56) References Cited

U.S. PATENT DOCUMENTS

FOREIGN PATENT DOCUMENTS

| JP | 04-343260 A | 11/1992 |
|---|---|---|
| JP | 05082534 A | 4/1993 |
| JP | 05175206 A | 7/1993 |
| JP | 06061250 A | 3/1994 |
| JP | 06112149 A | 4/1994 |
| JP | 08-017933 A | 1/1996 |
| JP | 10285321 A | 10/1998 |

OTHER PUBLICATIONS

Ankudinov, A. et al, "High injection regime of the super barrier(TM) rectifier," Solid-State Electronics, vol. 51, No. 5, pp. 714-718.
Ankudinov, A. et al, "Electrostatic force microscopy study of the electric field distribution in semiconductor laser diodes under applied biases," 9th Int. Symp. "Nanostructures: Physics and Technology," St. Petersburg, Russia, Jun. 18-22, 2001, pp. 198-201.
Ankudinov, A. et al., "Fine Structure of the Inner Electric Field in Semiconductor Laser Diodes Studied by EFM," Phys. Low-Dim. Struct., 3/4, 2001, pp. 9-16.
Ankudinov, A. et al., "Study of high power GaAs-based laser diodes operation and failure by cross-sectional electrostatic force microscopy," 10th Int. Symp. Nanostructures: Physics and Technology, Jun. 17-21, 2002, St. Petersburg, Russia, pp. 143-145.
Bashirov, A.M. et al., "Switching of thyristors using the dU/dt effect," Radiotekhnika i Elektronika, vol. 14, No. 2, USSR, Feb. 1969, pp. 374-375.
Bixby, B. et al., "Application Considerations for Very High Speed Fast Recovery Power Diodes," IEEE, IAS 1977 Annual, pp. 1023-1027.
Chelnokov, E. et al, "Effect of moving charge carriers in a collector junction of p-n-p-n structure on the switching on process," Radiotekhnika I Elektronika, v 16, USSR, 1971, pp. 1039-1046.
Christiansen, B. "Synchronous Rectification," PCIM, Aug. 1998.
Hikin, B. et al., "Reverse Recovery Process with Non-Uniform Lifetime Distribution in the Base of a Diode," IEEE, IAS 1977 Annual, pp. 644-647.
Huth, G., "Study of the Spatial Characteristics of the Breakdown Process in Silicon PN-Junctions," Proc. of the 2nd Int. Conf. on Transmutation Doping in Semiconductors, University of Missouri, Columbia, MO, Apr. 23-26, 1978, pp. 91-108.
Kuz'Min, V.A. et al., "P-N-P-N-Structures Turning on at High-Voltage and High-Current Density," Radiotekhnika I Elektronika, vol. 20, No. 7, USSR, 1975, pp. 1457-1465.
Kuz'min, V.A. et al., "The turn-on process of p-n-p-n structures at high voltages and a high current density," Radiotekhnika i Elektronika, vol. 20, No. 8, USSR, Aug. 1975, pp. 1710-1714.
Kuz'min, V.A. et al., "Turn-on of a p-n-p-n structure at a high current density," Radiotekhnika i Elektronika, vol. 18, No. 1, USSR, Jan. 1973.
Lorenz, L. et al., "Improved MOSFET, An Important Milestone Toward a New Power MOSFET Generation," PCIM, Sep. 1993.
Melnik, Y. et al., "HVPE GaN and AIGaN "Substrates" for Homoepitaxy," Materials Science Forum vols. 164-268, 1998, pp. 1121-1124.
Molibog, N.P. et al., "The effect of mobile charge carriers in the collector junction of a p-n-p-n structure on the turn-on process," Radiotekhnika i Elektronika, vol. 16, No. 6, USSR, Jun. 1971, pp. 1039-1046.
Pavlik, V.Y. et al., "The I-V characteristic of a p-n-p-n structure in the 'on' state for high residual voltages," Radiotekhnika i Elektronika, vol. 18, No. 7, USSR, Jul. 1974.
Rodov, V. et al, "Super barrier rectifier—a new generation of power diode," IEEE Transactions on Industry Applications, vol. 44, No. 1, pp. 234-237.
Rodov, V.I. et al., "Calculation of the Current-Voltage characteristic of an unsaturated p-n-p-n structure," Radiotekhnika i Elektronika, vol. 19, No. 6, USSR, Jun. 1974, pp. 1325-1326.
Rodov, V.I., "Non-one-dimensional processes in p-n-p-n structures," Poluprovodnikovye Pribory i ikh Primenenie, No. 28, USSR, 1974, pp. 3-22.
Vemulapati, U. et al., "The Concept of a Regenerative Diode", IEEE, 2007, pp. 193-196.
Office Action dated Mar. 3, 2011 from U.S. Appl. No. 12/359,094.
Office Action dated Mar. 3, 2011 from U.S. Appl. No. 12/238,308.
Office Action dated Sep. 16, 2009 from U.S. Appl. No. 12/238,308.
Office Action dated Aug. 9, 2010 from U.S. Appl. No. 12/359,094.
Office Action/Restriction Requirement dated Sep. 16, 2009 from U.S. Appl. No. 12/359,094.
Office Action dated Sep. 21, 2009 from U.S. Appl. No. 12/431,580.
Final Office Action dated Dec. 8, 2010 from U.S. Appl. No. 12/431,580.
Extended European Search Report dated Jan. 5, 2011 from European Application No. 09813383.8.
International Search Report dated Mar. 10, 2009 from International Application No. PCT/US2009/031885.
Written Opinion of the International Searching Authority dated Mar. 10, 2009 from International Application No. PCT/US2009/031885.
International Search Report dated Dec. 4, 2008 from International Application No. PCT/US2008/077747.
International Search Report dated Aug. 16, 2010 from International Application PCT/US2010/020284.
International Search Report dated Dec. 20, 2010 from International Application PCT/US2010/033451.
International Search Report dated Jun. 19, 2009 from International Application PCT/US2009/041996.
Written Opinion of the International Searching Authority dated Jun. 19, 2009 from International Application PCT/US2009/041996.
Office Action from U.S. Appl. No. 12/238,308 dated Mar. 3, 2011.
Office Action from U.S. Appl. No. 12/359,094 dated Mar. 3, 2011.
Office Action from U.S. Appl. No. 12/683,425 dated Dec. 27, 2011.
Office Action from U.S. Appl. No. 12/431,580, dated May 9, 2012.
Office Action from U.S. Appl. No. 12/431,580 dated Dec. 21, 2012.
Office Action from U.S. Appl. No. 12/359,094 dated Aug. 15, 2012.
Extended European Search Report from related European Patent Application No. 09739614.7, dated Nov. 12, 2012.
Office Action from U.S. Appl. No. 12/773,003 dated Dec. 6, 2012.

\* cited by examiner

ADJUSTABLE FIELD EFFECT RECTIFIER

RELATED APPLICATIONS

This application is a continuation of and claims the benefit under 35 U.S.C. §120 of U.S. patent application Ser. No. 12/238,308, filed Sep. 25, 2008, which is herein incorporated by reference in its entirety. U.S. patent application Ser. No. 12/238,308 claims the benefit under 35 U.S.C. §119(e) of provisional U.S. Patent Application Ser. No. 60/975,467, filed Sep. 26, 2007, having the same title as the present application, provisional U.S. Patent Application Ser. No. 61/022,968, filed Jan. 23, 2008, entitled "Regenerative Building Block and Diode Bridge Rectifier," and provisional U.S. Patent Application Ser. No. 61/048,336, filed Apr. 28, 2008, entitled "MOSFET with Integrated Field Effect Rectifier," all of which have the same inventors as the present application and are incorporated herein by reference in full for all purposes.

FIELD OF THE INVENTION

The present invention relates generally to rectifiers, and more particularly relates to rectifiers using a Field Effect structure.

BACKGROUND OF THE INVENTION

A rectifier is a two terminal device that is commonly used in electric circuits to conduct current in one direction and block current in the opposite direction. The main element of a rectifier is a potential barrier that controls current carrier flow depending on the sign of the potential applied to the external electrodes. Until recently only two major technologies were used to make rectifiers. In Schottky Barrier Diodes (SBD's), the potential barrier is created at the interface between a metal and a semiconductor. Such a barrier is defined by the difference between the work functions of the metal and the semiconductor that make the contact. SBD's provide very good low forward voltage drop (up to 0.4V), which is the major performance characteristic of a diode, but are known to have reliability problems. Due to the lack of carrier modulation they cannot withstand high forward current surges. Additional reliability problem arise due to the spiking during metallization process, which reduces the breakdown voltage and reduces overall yield. Even with the trench Schottky technology, which allows obtain higher breakdown voltage, practical SBD's are limited to breakdown voltages below 250V. The PN-junction technology is typically used for higher voltages. They provide usually higher $V_F$ (above 0.7V) and thus lower efficiency, but higher reliability. However, due to carrier density modulation they can withstand large current surges. Also since the maximum electric field is at the PN junction and not at the surface as in a SBD, the metallization spikes do not cause the early breakdown problem.

Other approaches, based on the field effect under an MOS gate, have been proposed in order to combine the high efficiency of a SBD with the high reliability of PN junction diodes. For example, in Pseudo-Schottky Barrier diodes and super barrier rectifiers, the potential barrier is created in the bulk of the semiconductor under the gate via processing (e.g. implantation, diffusion, oxidation etc.). The channel under the MOS gate is only weakly inverted and can be viewed as a barrier for majority carriers. The height of this barrier can be controlled by the gate thickness and the doping concentration under the gate. The presence of the barrier results in rectifying behavior similar to the SBD. SBD's can have a fixed barrier height, corresponding to the metals that make good contact with silicon, while in other prior art devices, the barrier height can be continuously changed. Short channel length and good control of the doping in the channel region are essential to making practical devices. The low voltage (breakdown below 100V) super barrier rectifiers have been shown to combine high reliability (similar to PN-junction diodes) and high efficiency.

However, many high voltage versions of such prior art devices (rated above 150V) exhibit negative differential resistance. Any negative resistance region can be useful to make oscillators, but in rectifiers this is undesirable behavior and needs to be avoided. Thus these prior art devices suffer from significant limitations at high voltages.

To overcome the inability of the prior art to operate reliably at high voltages, it is important to control the negative resistance region, which can involve either an increase or a decrease, depending upon other factors. The source of the negative resistance is the rapid reduction of the drift region resistivity due to the injected carriers. As shown in FIG. 1, which depicts a model of a typical prior art field effect barrier rectifier, the total drift region resistance is typically modeled as being divided into two parts, $R_1$ and $R_2$. The top resistance, $R_1$, typically controls the voltage on the P-N junction, and bottom $R_2$. Once the sum of voltage drops on the resistor $R_1$ and the channel is above the knee voltage V* of the P-N junction, the holes can be injected from P-N junction to the drift region. To maintain quasineutrality the electrons are injected from the substrate. This rapidly growing carrier concentration reduces the resistivity of the drift region and the voltage drop on resistor $R_2$. This voltage drop on the drift region can lead to the negative resistance. The negative resistance can be effectively controlled by varying resistor $R_1$ because it changes the critical current when the injection starts (I*), and because the slope of negative resistance depends on the ratio of $R_2/R_1$. Thus the $R_1$ reduction increases the negative resistance region and the $R_1$ increase reduces the negative resistance region.

$$\frac{R_2}{R_1} = \frac{N_{D1}A_1W_2}{N_{D2}A_2W_1},$$

where $A_2$ is the total area of the drain region and $A_1$ is smaller since current cannot flow through the P region. $W_1$ is close to the thickness of the P region and $W_2$ is the distance between the P region and substrate. The required breakdown voltage sets the donor concentration in the bottom epitaxial region ($N_{D2}$), but the donor concentration in the top region ($N_{D1}$) can be adjusted.

One of the ways to control negative resistance in Field Effect Rectifiers is to adjust the donor concentration in the top layer, which was analyzed in Rodov V., Ankoudinov A. L., Ghosh P., Solid State Electronics 2007; 51:714-718. There a reduction of $N_{D1}$ twice, by the use of a double layer epitaxial structure, was enough to remove negative resistance from the I-V curve. However, this solution of the negative resistance problem may be not the best practical approach, since it is more difficult to manufacture double layer epitaxial structures.

Another major concern is how fast the diode can be switched from forward current conduction to reverse current blocking. One of the major concerns in reverse recovery is the storage time which depends at least in part on how much charge is present in the barrier region. It takes some time to remove this charge, before the depletion layer can be developed to support reverse voltage. The total stored charge still largely determines the total reverse recovery, however some reasonable amount of storage charge is useful since it can provide soft recovery and reduce electro-magnetic interference problems. Thus the softness of reverse recovery is affected by the total stored charge and junction capacitance. To optimize diode reverse recovery it is helpful to be able to quickly deplete the channel region and to be able to trade off between speed of reverse recovery and electromagnetic emissions.

A brief overview of the prior art leads to following conclusions:

Field Effect Diodes provide a good combination of performance and reliability which cannot be achieved by conventional Schottky or PN-junction technologies.

To avoid negative resistance, prior art Field Effect Diodes typically need special means to adjust the top layer resistance.

The ability to rapidly deplete the channel region and operate at high frequency without large electromagnetic interference is desirable in at least some embodiments.

SUMMARY OF THE INVENTION

The present invention comprises an Adjustable Field Effect Rectifier (sometimes "AFER" hereinafter) device having an adjustment pocket or region which permits the device to function reliably and efficiently at high voltages without the negative resistance of prior art devices, while also permitting fast recovery and operation at high frequency without large electromagnetic interference. The process for fabricating a device according to the invention comprises opening the gate oxide followed by ion implantation to create a dopant concentration below that opening. The opening can be covered by oxide, if contact between the doped region and the metal is not desired.

The introduction of the adjustment pocket of the present invention gives a much more flexible device design because it allows modification of the top layer resistance during processing. In some embodiments, it is desirable to increase the top layer resistance, which can be accomplished by a P+ implantation into the pocket. Alternatively, an N+ implantation is used to decrease the top layer resistance. For high voltage devices, the P+ implant is useful to remove negative resistance and thus correct Field Effect rectifier performance. The N+ implant is useful to improve the performance of low voltage diodes. Additional advantages of the adjustment pocket structure are to allow the reduction of the junction capacitance and of the charge stored in the channel area, thus improving the reverse recovery characteristics of the diode.

The present invention can be better understood from the following Detailed Description of the Invention, taken in combination with the appended Figures, as described below.

THE FIGURES

FIG. 1 illustrates a prior art structure of the Field Effect barrier rectifier. Oxide on the top is a remnant of the self-alignment process and represents a problem for metal adhesion and thermal heat removal. Resistance R1 needs to be reduced to address negative resistance problem.

FIG. 2 illustrates an embodiment of the Adjustable Field Effect Rectifier (AFER) in accordance with the invention. Resistance R1 is reduced by the geometry and resolves the negative resistance problem. The embodiment also promotes better thermal and electrical contact.

FIG. 3 is a schematic representation of an embodiment of an AFER as a MOSFET with gate electrode shorted to the source. Polarity of the diode is the same as that of the MOSFET intrinsic body diode. Such shorted MOSFET will not always function as an efficient diode, and structural parameters (gate oxide thickness, channel length, etc.) need to be chosen carefully.

FIG. 4 illustrates the operation of the AFER. During forward bias the depletion layers from various P-regions do not overlap (shown by dashes) and electrons can easily flow from the channel region to the drain. During reverse bias depletion layers grow in size and after pinch-off start to overlap (see dash-dots). This pinch-off effect helps to reduce the leakage of the device.

FIG. 5 illustrates in graphical form forward current density versus applied voltage for an embodiment of a 600 V AFER. The structure without adjustment area exhibits negative resistance (leftmost curve at V axis). Introduction of the adjustment area 0.25 um (middle curve at V axis) or 0.35 um (rightmost curve at V axis) wide fixes the problem. The width and doping concentration in the adjustment area can be used also to improve device performance at low current density.

FIG. 6 shows an intermediate structure after vertical etching through the polysilicon gate and gate oxide (can leave some of gate oxide to reduce the channeling) using the Gate mask.

FIG. 7 illustrates a cover mask placed on the Gate mask to cover the adjustment area opening.

FIG. 8 illustrates the structure of an embodiment after a P+ well boron implant and contact arsenic implant are performed.

FIG. 9 illustrates a trench etched in silicon to provide ohmic contact to the P-well. Notice that only small portion of implanted As is left.

FIG. 10 illustrates an embodiment after both masks are isotropically etched. This self-aligning step provides uniform barrier height throughout the device.

Figure 11:
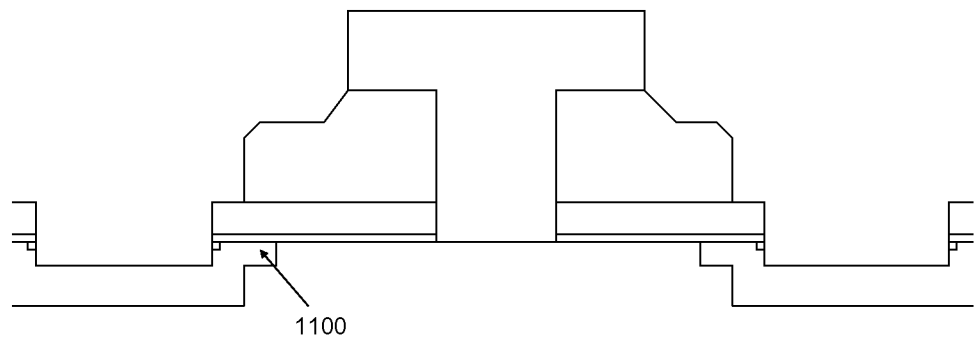

FIG. 11 illustrates an embodiment after channel boron is implanted. The Implantation dose determines the potential barrier height inside the channel. It is desirable to use a self-aligning process in at least some embodiments to help ensure having the same barrier height throughout the chip.

Figure 12:
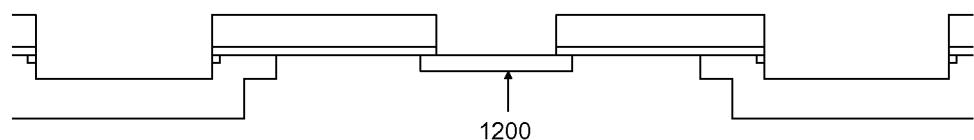

FIG. 12 shows an embodiment after the Gate and Cover masks are removed. Contact boron is implanted. If the dose is high, the barrier height in the adjustment area is higher than in the channel region. In this case it can be a final structure. Otherwise, oxide or oxide walls can be put in the adjustment area, as shown below.

Figure 13:
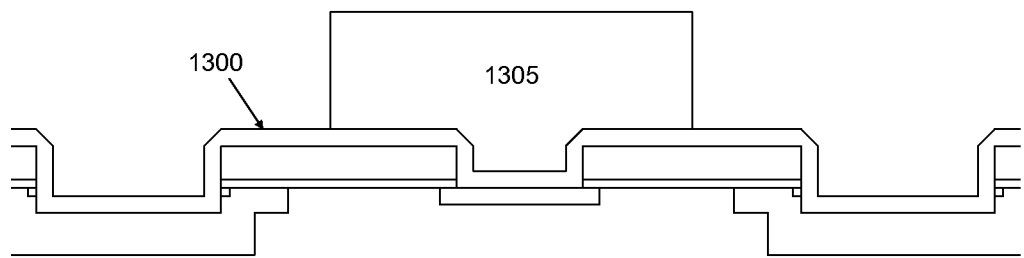

FIG. 13 shows an embodiment after the insulating oxide layer is deposited. The Cover mask is placed to keep oxide in the adjustment area.

Figure 14:
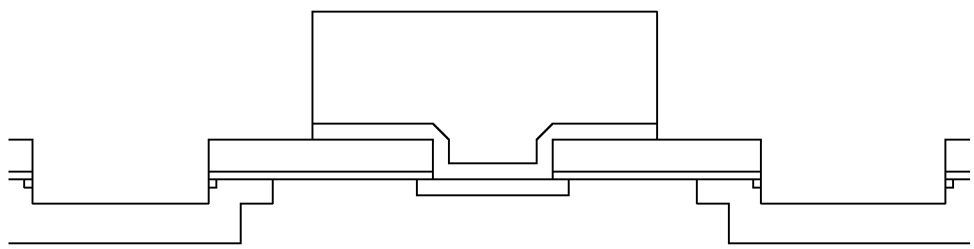

FIG. 14 shows an embodiment after the oxide is etched.

Figure 1:
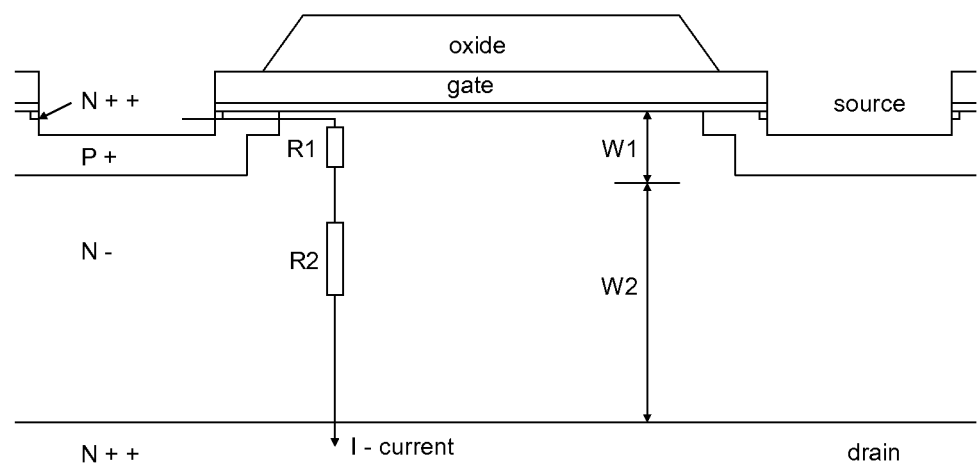
Figure 15:
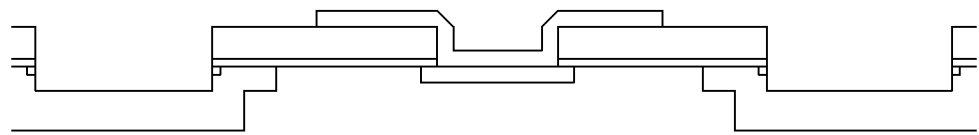

FIG. 15 shows an embodiment after the cover mask is removed. It can used as a final structure in some implementations, which prevents any current through the adjustment area. This is the structure if adjustment area implant type was the same as EPI type in order to reduce resistor (in this case contact implant can be done before Cover mask is placed for the first time—see FIG. 1).

Figure 16:
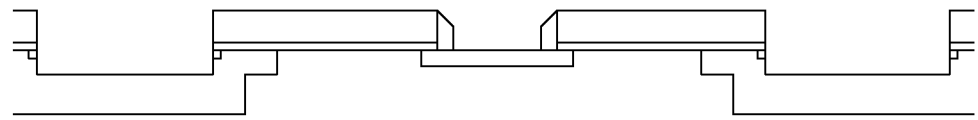

FIG. 16 shows an embodiment where the oxide is vertically etched to leave just the oxide sidewalls, and can be the final structure for some embodiments. This final structure is preferred when the contact implant is of the opposite type than the EPI type. Without an oxide side wall the potential barrier under the gate in the adjustment area can be too small in some implementations.

DETAILED DESCRIPTION OF THE INVENTION

Figure 2:
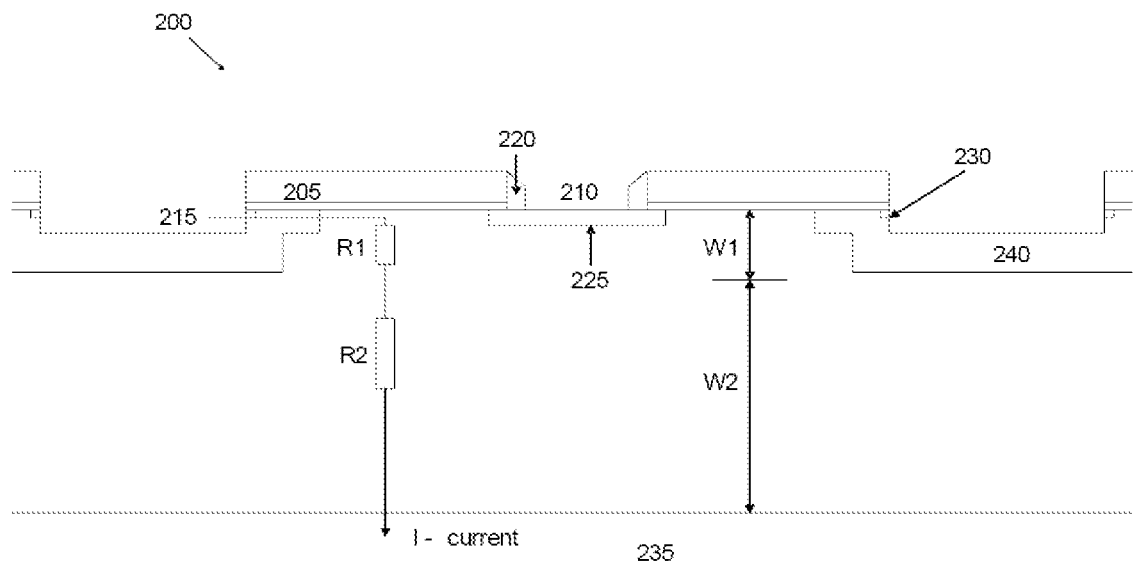

Referring first to FIG. 2, en embodiment of an Adjustable Field Effect Rectifier (sometimes abbreviated as "AFER" hereinafter for simplicity) in accordance with the invention is shown generally at 200, and in the illustrated arrangement includes an adjustment area, or pocket, discussed in greater detail hereinafter. The barrier for the carrier transport is created under the MOS gate 205 due to the field effect. The barrier height is controlled by the gate material, the gate oxide thickness and the doping concentration in the semiconductor under the gate. A pocket 210 is etched in the middle of the gate, and a shallow P+ implant is created under that opening, which can be insulated from the source 215 via oxide layer 220 or directly connected to the source electrode (for faster performance). The described arrangement is depicted in FIG. 2. For clarity the connection between the source, gate and pocket area is omitted from FIG. 2, but is included in FIG. 4. The connection is typically implemented by a conductive layer, such as a metal layer, for example The shallow P+ implant 225 restricts the current flow of majority carriers, thus increasing the top layer resistance R1. Those skilled in the art will appreciate that the device of the present invention can be either N-type or P-type, depending upon the substrate and related processing. For purposes of clarity, an N-type substrate is described hereinafter, but is not to be considered limiting.

The adjustment pocket 210 comprises an opening 225 in the gate 205, into which a dopant is implanted. In some embodiments, the adjustment pocket can also comprise an oxide over the opening 220 to assist in ensuring that no significant current can pass through adjustment area. In at least some embodiments, it is desirable to have substantially identical resistors from both sides of the gate opening, to prevent one side from becoming less active during operation. Such an imbalance can cause deterioration in device performance. To facilitate creating substantially equal resistance on both sides of the gate, a self-aligning processing is used in an embodiment The small N+ contact 230 provide the ohmic contact to the metal for electrons flow. In some embodiments, the N+ contact can be avoided if the Schottky barrier height at the contact is smaller than the barrier height under the gate. In such an embodiment the rectifying behavior is determined by the channel barrier and not the Schottky barrier height. The N++ substrate 235 provides ohmic contact on the backside of the structure and provides as many electrons as holes generated by the P-well 240, thereby maintaining quasineutrality.

Figure 3:
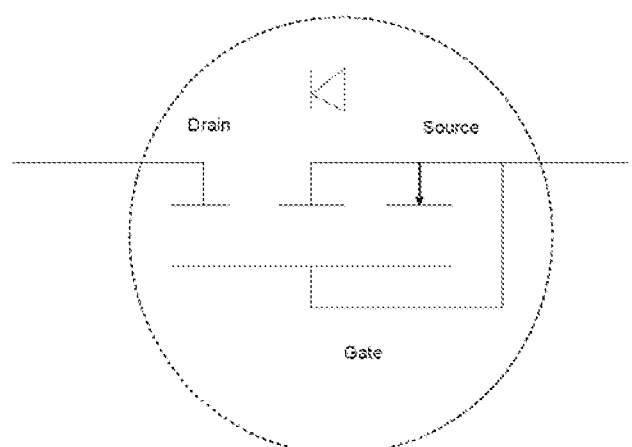

In a simplified view, the AFER structure of the present invention resembles the structure of a MOSFET, with the gate shorted to the source. Thus a MOSFET's electric circuit symbol can be modified to represent the AFER device, as shown in FIG. 3. However, in order to function as an efficient rectifier in accordance with the present invention, the structural parameters (gate oxide thickness, channel length, distance between channels, etc.) are significantly modified, including substantial removal of a layer of oxide that, in the prior art, would insulate the gate and source. In addition, the adjustment area is added, and is also shorted to the gate and the source. The result is that the structure of the present invention behaves as a high performance diode which does not exhibit negative resistance. The polarity of that resulting diode is the same as that of the intrinsic body diode. Thus for an N-type device the source electrode will become anode of the diode, and for a P-type device the source will be cathode of the diode.

Figure 4:
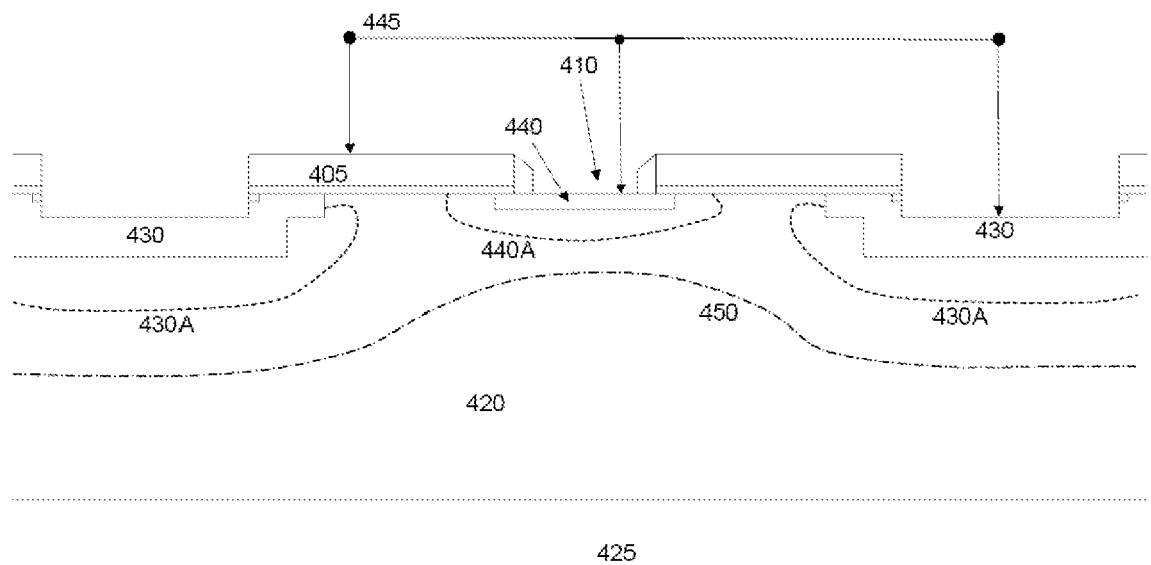

Referring next to FIG. 4, in forward bias, the current flows from the top source electrode 410 horizontally under the gate 405 to get over the channel barrier for carrier transport. Then the current spreads through the N-epitaxial layer 420, changes to a mostly vertical direction, and flows toward the drain electrode 425. The depletion layers of the P-well 430 and shallow P implant 440 (dashed lines 430A and 440A on FIG. 4) do not overlap, but restrict current flow to a narrow region and determine resistance R1. The vertical intrinsic PN diode 430 does not play any role until the combined voltage drop on the channel and resistance R1 reaches the "knee" voltage (about 0.6V). Above that voltage the P-well 430 injects holes into the N-epitaxial layer 420, which leads to conductivity modulation and provides the field effect rectifier of the present invention with the ability to handle large forward surge current.

During reverse bias, and because of the connection 445 shown between the source, gate and pocket area, the depletion layers 430A and 440A around the P-well 430 and P-pocket 440 grow in size and eventually start to overlap as shown at dotted dashed curve 450 on FIG. 4. It will be appreciated by those skilled in the art that the curve 450 can be thought of as an equipotential line that serves to describe the growth of the depletion layer during reverse bias. This determines a leakage current of the device. For the higher applied reverse bias the depletion layer behavior is similar to that of the PN junction diode. Note that P-pocket promotes the earlier pinch-off and lower leakage current of the device.

In at least several embodiments, the adjustment pocket provides several important improvements to device performance during the switching between forward and reverse bias. Since part of the gate is removed, junction capacitance is automatically reduced. This also means that fewer carriers will be accumulated under the gate when the device is forward biased. This further reduces the storage time that has to elapse before the depletion layer starts to develop during reverse recovery. Thus, in an embodiment, the traditional methods for controlling carrier lifetime (e.g. electron irradiation), together with the adjustment pocket, allows optimization for reverse recovery, which in turn permits operation at maximum frequency with minimum electromagnetic interference.

Figure 5:
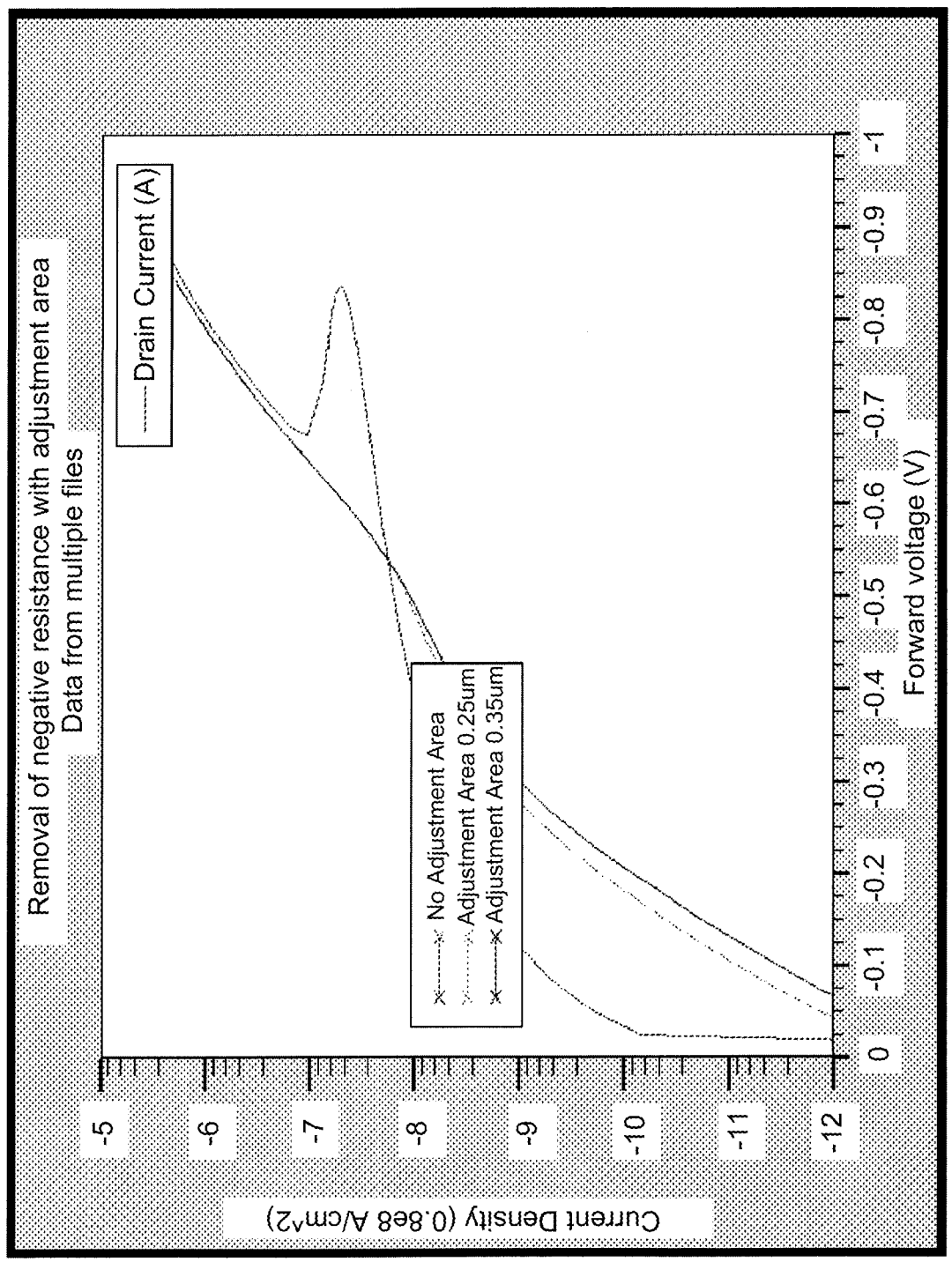

As illustrated in FIG. 5, in at least some embodiments the adjustment region also provides adjustment of the top resistor to avoid negative resistance in high voltage AFERs. The leftmost curve at the V axis shows the I-V characteristic of the diode without the adjustment area of the present invention, and exhibits negative resistance. The middle curve at the V axis shows the I-V curve for the same device parameters with an adjustment area of 0.25 µm added in accordance with the present invention, and shows no trace of the negative resistance. The rightmost curve at the V axis shows the I-V curve for a device with 0.35 µm, and also shows elimination of the negative resistance. This method of controlling negative resistance has the advantage that uniform dopant concentration can be used, which is simpler to manufacture.

Low voltage devices, with a breakdown voltage below 100 volts, typically do not have the negative resistance problem. To optimize these structures, it is desirable to minimize the forward voltage of the device while keeping leakage at acceptable level. In some embodiments, the adjustment region also helps such optimization by including an N+ pocket implant to reduce the resistance modeled as resistor R1 in FIG. 2. In these embodiments a thick oxide is preferably deposited in the adjustment pocket, to prevent the current flow through the pocket. This step is included within the process flow discussed below, although it is not required in all embodiments.

Those skilled in the art will appreciate that the AFER structure described above provides improvements in reverse recovery as well as controlling the value of the top resistance R1. As discussed above, an increased value of R1 is useful for high voltage devices to solve the negative resistance problem, while a reduced value of R1 can be used to improve efficiency of the low voltage devices.

Referring next to FIGS. 6-16, generally, one embodiment of a process for manufacturing AFER devices can be better appreciated. It is assumed that an epitaxial layer has been grown on a substrate, together with the following steps that are typical of production of semiconductor devices and so are not shown in detail. The breakdown voltage can be adjusted by varying the doping concentration (N-type) and the thickness of this epitaxial layer. A guard ring (GR) structure, on the order of 0.5 to 5 µm in at least some embodiments, is built using one of the standard methods, and a field oxide is formed by either thermal oxidation, CVD of silicon oxide, a combination of the two, or any other suitable method. The guard ring mask is used to open a window in the field oxide, through which a P-well implant is introduced, followed by thermal diffusion. The field mask is then used to open a window in the field oxide for fabrication of the active area of the device.

Figure 6:
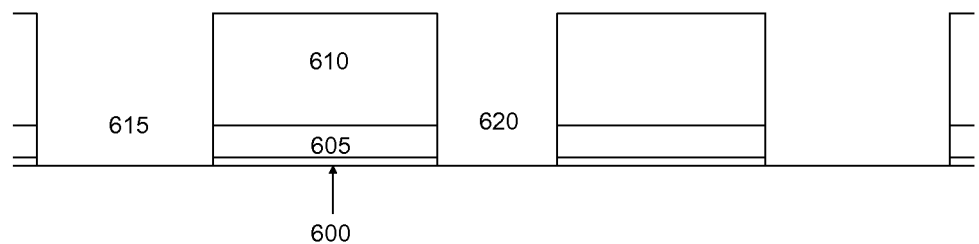
FIGS. 6-16 illustrate processing steps for fabricating an embodiment of the invention. In particular.

Referring particularly to FIG. 6, a gate oxide 600 is grown to on the order of 30-200 Å, following by growing a layer of polysilicon 605 on the order of 600-1200 Å. A gate mask 610 is then developed, after which the polysilicon 605 is vertically etched, resulting in the structure shown in FIG. 6 with openings 615 and 620. If a reduction of the resistance shown as R1 in FIG. 2 is desired for the particular embodiment, a contact arsenic (As) implantation can be done at this stage through the openings 615 and 620.

Figure 7:
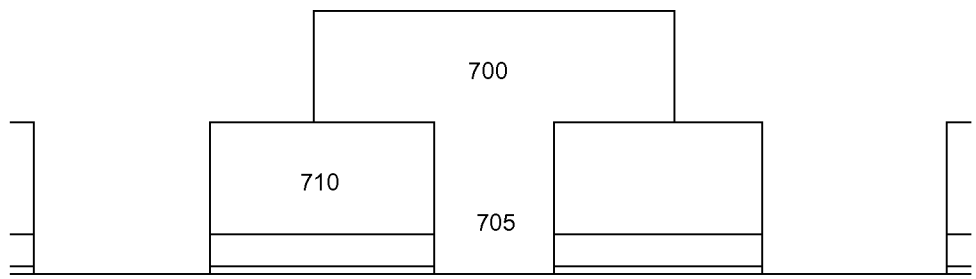

Referring next to FIG. 7, a second cover mask 700 is made on top of the gate mask 710 to cover the adjustment pocket 705. In some embodiments, it is desirable to adhesively affix the gate mask to the wafer, or, alternatively, to fabricate the gate mask from silicon nitride or other suitable material. This masking arrangement facilitates use of self-aligning process with uniform barrier heights and R1 values throughout the entire area of the device.

Figure 8:
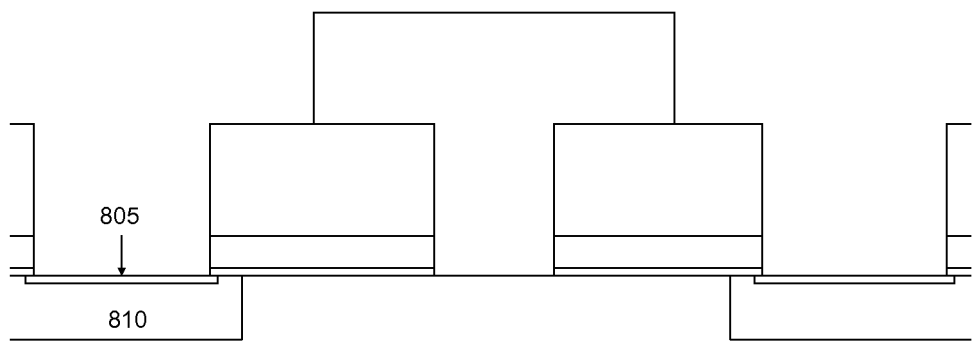

Referring next to FIG. 8, the contact arsenic implant 805 and P-well boron are implanted, resulting in P-wells 810. In some embodiments, the dose of P-well boron is selected to be high enough to restrict the main current flow through the channel area.

Figure 9:
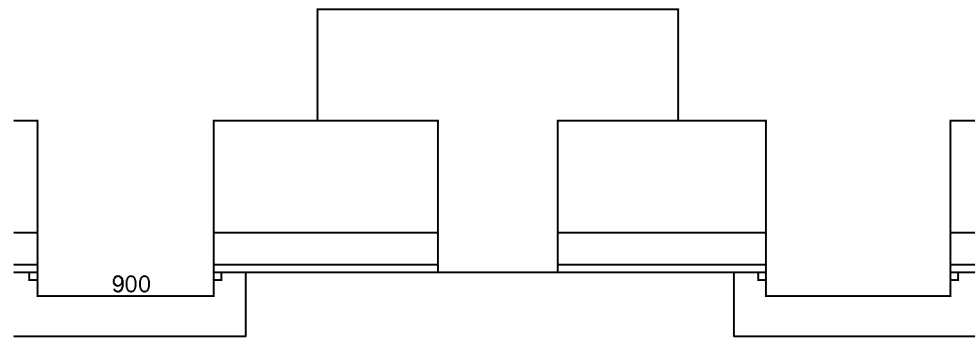

Referring next to FIG. 9, a contact well 900 is vertically etched into the silicon to provide contact to the P-well. In the absence of such a contact, the charge in the P-well can be affected by the hole current that flows to the anode through the P-wells of the guard ring structure. In some instances, this may slow down device operation. The contact wells help to optimize the use of the active device area and allow holes from P-well to flow directly to the source electrode. In addition, sufficient ohmic contact is preserved to allow for the flow of electrons, since most of the electron current is flowing through the narrow channel under the gate. It will be appreciated by those skilled in the art that, in some embodiments, only a small portion of the implanted As remains after formation of the contact wells.

Figure 10:
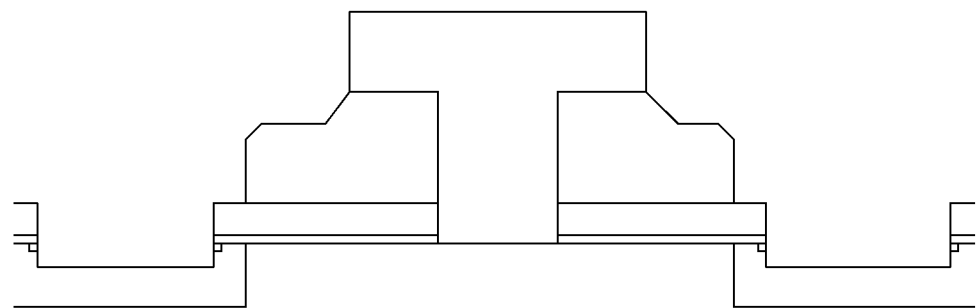

Referring next to FIG. 10, the gate mask 710 and the cover mask 700 are isotropically etched, which provides a self-aligned mask for a channel boron 1100 implantation shown in FIG. 11, thus helping to assure uniform barrier height throughout the relevant portion of the device. The cover mask is also etched at this stage, while still covering the adjustment area.

Referring to FIG. 12, the gate and cover masks are removed, followed by a P-type pocket 1200 implant to increase the resistance R1 of the top region, to restrict current flow. In some embodiments, and particularly those where the doping concentration under the gate in the adjustment pocket is larger than that in the channel region, the structure shown in FIG. 12 is the final structure. This can make further processing steps unnecessary.

However, in some embodiments, it is desirable to further develop the adjustment pocket by adding oxide sidewalls or a layer of oxide. This is shown beginning with FIG. 13, where a layer of oxide (identified by numeral 1300) on the order of 50-500 Å thick is deposited, followed by placement of a cover mask 1305. Then, referring to FIG. 14, the oxide is vertically etched, followed by removing the cover mask 1305, shown in FIG. 15. FIG. 15 depicts the final structure for those embodiments where the resistance shown as R1 in FIG. 2 is to be reduced, and an N-type implantation was made in the adjustment area. This approach permits reduction of R1 while also preventing electrons from flowing to the source through the opening of the adjustment area.

Next, as shown in FIG. 16, the oxide is vertically etched until only the oxide sidewalls are left. This structure depicts the final structure if the value of R1 is to be increased, together with the use of P-type implantation in the adjustment area. This structure permits holes from the P-contact in the adjustment area to flow to the source electrode, thus allowing for fast operation, while at the same time limiting electron flow to the source only through the channel region.

Having fully described an embodiment of the invention, together with numerous alternatives and equivalents, those skilled in the art will appreciate that numerous alternatives and equivalents exist which do not depart from the invention and are intended to be included within its scope. As a result, the invention is not to be limited by the foregoing description.

We claim:
1. An apparatus comprising:
an epitaxial layer of a first conductivity and having first and second opposing sides;
a drain in said second side of said epitaxial layer;
a source in said first side of said epitaxial layer;
a gate dielectric layer on the first side of said epitaxial layer and being adjacent said source;
a gate contact layer on said gate dielectric layer;
said gate dielectric layer and said gate contact layer defining an opening therethrough;
a first well of the second conductivity in the epitaxial layer and being aligned with the opening;
an insulating layer in the opening and on said first well;
a second well of the second conductivity in the first side of said epitaxial layer, said second well being spaced apart from and having a depth greater than a depth of said first well;
a first electrically conductive contact coupled to the gate contact layer, and at least one of the first and second wells; and
a second electrically conductive contact coupled to the drain.
2. The apparatus of claim 1 further comprising an Ohmic contact adjacent said second well.
3. The apparatus of claim 1 wherein said insulating layer is configured to prevent current from passing through said epitaxial layer.

4. The apparatus of claim 3 wherein said insulating layer is configured to prevent current from passing through said epitaxial layer to said first well.

5. The apparatus of claim 1 wherein said gate dielectric layer comprises an oxide layer.

6. The apparatus of claim 1 wherein said gate dielectric layer extends over said first well.

7. The apparatus of claim 1 wherein said epitaxial layer defines first and second resistances between said source and said drain.

8. The apparatus of claim 1 wherein said epitaxial layer has a depth greater than the depth of said second well.

9. The apparatus of claim 1 further comprising a third well of the second conductivity in the first opposing side of said epitaxial layer for defining said source.

* * * * *